US007256999B1

(12) United States Patent
Heady

(10) Patent No.: US 7,256,999 B1
(45) Date of Patent: Aug. 14, 2007

(54) HEAT COLLECTOR PLATE FOR AN ELECTRONIC DISPLAY

(75) Inventor: Gregory S. Heady, Scottsdale, AZ (US)

(73) Assignee: Frontline Systems, Phoenix, AZ (US)

( * ) Notice: Subject to any disclaimer, the term of this patent is extended or adjusted under 35 U.S.C. 154(b) by 208 days.

(21) Appl. No.: 10/823,476

(22) Filed: Apr. 12, 2004

(51) Int. Cl.
H05K 7/20 (2006.01)
F28D 7/12 (2006.01)

(52) U.S. Cl. .................. 361/700; 361/702; 361/707; 165/80.4; 165/104.33; 165/142

(58) Field of Classification Search ............. 361/600, 361/700, 702, 707; 62/519, 524; 165/142, 165/104.33, 80.4
See application file for complete search history.

(56) References Cited

U.S. PATENT DOCUMENTS

| 3,283,811 | A | * | 11/1966 | Harvey | 165/142 |
| 4,882,654 | A | * | 11/1989 | Nelson et al. | 361/701 |
| 5,394,936 | A | * | 3/1995 | Budelman | 165/104.33 |
| 5,761,037 | A | * | 6/1998 | Anderson et al. | 361/700 |
| 5,921,315 | A | * | 7/1999 | Dinh | 165/104.21 |
| 5,991,153 | A | | 11/1999 | Heady et al. | |
| 6,536,510 | B2 | * | 3/2003 | Khrustalev et al. | 165/104.33 |
| 2002/0195230 | A1 | * | 12/2002 | Li | 165/104.33 |
| 2003/0010477 | A1 | * | 1/2003 | Khrustalev et al. | 165/104.33 |

* cited by examiner

*Primary Examiner*—Michael Datskovskiy
*Assistant Examiner*—Robert Hoffberg
(74) *Attorney, Agent, or Firm*—Schmeiser, Olsen & Watts LLP

(57) ABSTRACT

A heat collector includes a heat sink. A recess in the heat sink either forms or receives internal gas and liquid phase lines. A manifold may be integrally formed in the heat sink or may be added on. The manifold combines separate input and output connections into a composite input and output connection. An internal composite line may include the internal gas and liquid phase lines and may be connected to the composite connection of the manifold. The internal liquid phase line is fluidly connected to the internal gas phase line in a transition region of the composite line. Advantageously, the internal liquid phase line may be disposed inside the internal gas phase line for protection and positive heat transfer effects. A cover may hold the composite line in the recess and provide good thermal contact between the lines and the heat sink.

28 Claims, 8 Drawing Sheets

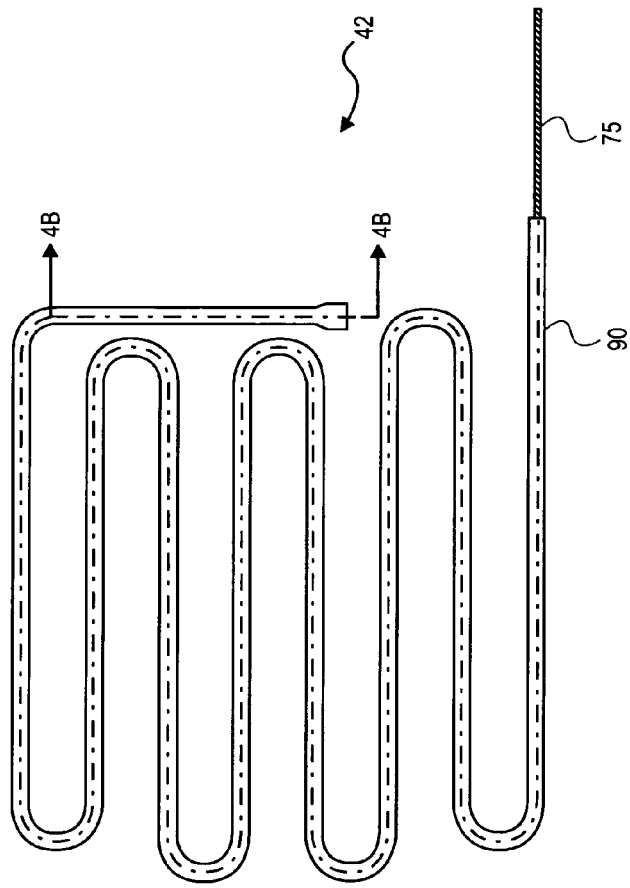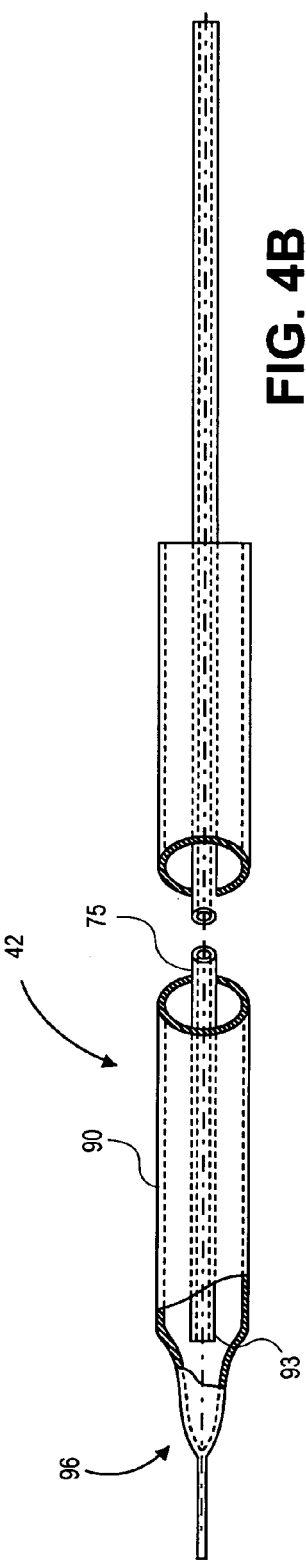
FIG. 4A
FIG. 4B

HEAT COLLECTOR PLATE FOR AN ELECTRONIC DISPLAY

BACKGROUND OF THE INVENTION

1. Technical Field

This invention generally relates to heat sinks for collecting heat, and in particular to a heat collector plate for an electronic display.

2. State of the Art

The prior art predominantly includes convective heat transfer systems for electronic displays.

DISCLOSURE OF THE INVENTION

The present invention relates to a heat collector plate for an electronic display. This invention has many features that are different from those of Applicant's own disclosure in U.S. Pat. No. 5,991,153, issued to Gregory S. Heady et al. Nov. 23, 1999 and entitled "Heat Transfer System for an Electronic Display", the disclosure of which is incorporated herein in its entirety. However, much of the disclosure of U.S. Pat. No. 5,991,153 provides a background for the improvements of the present invention. Furthermore, the features of the present invention in combination with those of the prior patent represent significant and advantageous advances in the art that were not obvious at the time of this invention.

The present invention also has many features that are useable together with the inventions disclosed in Applicant's own disclosure in U.S. patent application Ser. No. 10/823,477, filed Apr. 12, 2004 and entitled "Cooling System for an Electronic Display", the disclosure of which is incorporated herein in its entirety.

In particular, cooling devices for electronic displays of the past have generally used convective heat dissipation systems that function to cool an entire interior of the display by one or more fans and fins. This is not adequate in many climates. Especially when radiative heat transfer from the sun through a display window becomes a factor. In many applications and locations 200 Watts or more of power through such a window is common. With increased electronic display screen size and corresponding display window size more heat will be transmitted into the displays. In the past, many displays have functioned satisfactorily with ten to twelve inch screens. Now, many systems need screens of sizes greater than or equal to twelve inches. In particular, many applications call for fifteen inch displays. With increased heat production with the screens of larger sizes and radiative heat transfer from the sun through the display window, heat dissipation systems of the past that attempt to cool the entire interior of the display with fins and fans are no longer adequate.

The embodiments of the subject invention disclosed below may be beneficially applied in order to make consistent cooling of an electronic display having screens of sizes greater than or equal to twelve inches, even in extremely hot climates. The present invention implements insulative materials, improved contact between elements for increased conductive heat transfer, and a two phase refrigerant in conjunction with isolating the compressor from the volume to be cooled. Several exemplary depictions and explanations are provided in the drawings and descriptions below.

Separating the compressor from the electronics physically separates the heat creating compressor and associated fins from the electronics that the system is trying to cool. This lessens the opportunity for the heat from the compressor to be returned to the electronic components. Isolation of the compressor from the electronics may also be beneficial in applications that have restrictions on how close certain components may be placed to the displays. For example, refrigerant type cooling systems would typically not be approved for gasoline display pumps because of the fire hazards associated with the contactors that switch the cooling system on. However, if the compressor and associated components can be isolated from a gasoline pump and display, the possibility of a fire hazard may be reduced or eliminated. In fact, in one embodiment, a large compressor may be isolated in a canopy or roof. A regulator may control flow through a plurality of lines communicating between the compressor and a corresponding plurality of pumps. Thus, such an embodiment opens possibilities of providing effective cooling in gasoline pump displays and other applications.

Convective heat transfer cooling systems of the past used in conjunction with electronic components has the disadvantage of pulling dust in from outside and placing the dust in close proximity to components that inherently have electrostatically attractive charges. Thus, function and life of the components are compromised. A large fluctuation in temperature that is common in the past devices also adversely affects the electronic components. For example, with a ten degree average temperature fluctuation from a standard twenty-two degrees C., the mean time before failure (MTBF) of an liquid crystal display (LCD) screen will be cut in half. Thus, with the non refrigerant cooling systems of the past, the MTBF of an LCD screen was approximately eighteen months to approximately twenty-four months. Advantageously, using an embodiment of the present invention will likely improve the MTBF to a range from approximately five years to approximately seven years.

While sealing off a volume in which the electronic components reside may seem counterintuitive in light of the past convective cooling systems, sealing the volume surrounding the electronics has the advantages of reducing the amount of dust that will collect on the components. Furthermore, sealing a smaller volume that more tightly encloses the electronic components reduces the mass that needs to be maintained at a cool temperature. While electronic displays having screens between ten and twelve inches could be cooled adequately with the convective heat transfer of the past, screens of greater than or equal to twelve inches call for the improved cooling capabilities of the present invention. For example, fifteen inch screens necessitate the improved cooling capabilities described herein. It is to be noted that fans may also be implemented with the sealed configurations of the present invention. This may provide the advantage of adding convective heat transfer while isolating the electronic components from external dust. The present invention may be sealed to withstand pressures in a range from approximately plus 3.5 psi absolute to approximately minus 3.5 psi absolute. Sealing to this level equates to providing an enclosure that can withstand 800 pounds of force on a window corresponding in size to the 15 inch screen.

Whereas the systems of the past attempted to remove heat out of all of the sides of the enclosure surrounding the electronic, as explained hereafter one may insulate the enclosure as much as possible and remove the heat via a two phase fluid to a remote location where the heat is dissipated. For example, if a display screen is included in the electronics that must be viewed through one of the sides, then five sides will be insulated. In the case of no display, all sides (six, in the case of a hexahedron) will be insulated. Parts of any side may be insulated if the full side cannot be insulated.

One or more temperature sensors may be incorporated with an embodiment of the present invention. One temperature sensor may be placed at an upstream end of liquid phase line within the heat collector plate of the present invention. When this sensor detects a temperature that is too high, it sends a signal that causes the system to prevent liquid from being sent to the compressor. Another temperature sensor may be located at the compressor. The temperature sensor at the compressor may be used to detect the case in which the temperatures are below a predetermined threshold, in which case the compressor will be turned off until the temperature in the display again requires cooling. Predetermined thresholds may be selected and the system may be configured with a thermostat to advantageously keep an interior of the enclosure at a relatively constant temperature, or at least within a range of acceptable temperatures.

In another embodiment of the present invention the system may be provided as a set of components that can be implemented on existing electronics displays. In this regard, the system may include an enclosure cover on at least one side of the heat collector plate. That is, the system may include as few as two components, the heat collector plate to be applied to an existing display and a cover for enclosing the heat collector plate in an enclosure with the electronics of the display. The system may further include internal gas and liquid phase lines inside the heat collector plate and external gas and liquid phase lines extending from the heat collector plate through or around the enclosure cover and to a compressor. The system may include a thermally conductive mastic between the internal gas phase line and the heat collector plate. The system may also include the compressor with any number of components associated with the compressor. The system may include insulation between the enclosure cover and the heat collector plate and other insulation. This material may comprise any of a variety of materials including foam. The enclosure cover may likewise comprise an insulative material such an insulative ABS that is also non flammable. The system may also include fasteners for holding the various components together and for holding the enclosure cover and heat collector plate to the electronics portion of the display. For contacting and conducting heat away from the electronics portion, the system may include a base. The heat collector plate may be configured to interface with a particular base. Alternatively, a base may be configured to interface with a particular electronics display and with the heat collector plate.

As may be appreciated, any number of system components may be provided as a kit for a particular display or set of displays. Thus, kits may be customized to meet typical servicing needs. For example, a kit may include one or more replacement lines. On the other hand, a kit could include any number of components including all lines, an enclosure cover, enclosure cover insulation, a heat collector plate, a base, and an electronic display.

A base plate may be thermally connected to the circuitry and thermally connected to the heat collector. The base plate may include a thermal conductor configured to interface with the circuitry in a predetermined manner. The circuitry may be a circuitry of a particular electronic display and the base plate may be configured to fit on the circuitry in a thermally conductive condition. The base plate may include fins to enhance convective heat transfer from the circuitry. The base plate may additionally or alternatively include at least one recess to accommodate at least one electrical component of the electronic display. The base plate may not be configured in a form commonly thought to be a plate at all, but may have any configuration that matches the electronic components and heat collector with which it is implemented. Furthermore, it is to be understood that the electronic display may be provided integrally with the base plate. As such, the electronic display and the base plate may form part of an overall heat sink including the heat collector plate.

In a simple form, a heat collector of the present invention may include a heat sink. A liquid phase line and a gas phase line may be fluidly connected to each other and may be thermally connected to the heat sink. The heat collector may be for an electronic display and may include a heat sink in conjunction with a display screen of the electronic display. The heat sink may include a channel for receiving at least a portion of the gas phase line. The channel may be of any configuration. For example, the channel may be serpentine and the gas phase line may also be serpentine and fit into the channel. A thermally conductive material may be placed between the portion of the gas phase line and the heat sink to improve conductive heat transfer.

The liquid phase line may extend coincidentally with the portion of the gas phase line. Furthermore, the liquid phase line may be disposed inside the gas phase line. The liquid phase line may be integral with the gas phase line. In one case, the gas phase line may be at least partially formed by a portion of the heat sink. Likewise, the liquid phase line may be at least partially formed by a portion of the heat sink.

The heat collector may further include a heat sink cover plate mounted to the heat sink with at least a portion of the gas phase line between the heat sink cover plate and the heat sink. Through holes may be provided in the heat sink for receiving fasteners therethrough.

The heat sink may have an opening for inlet and outlet. This opening may receive both the gas phase line and the liquid phase line therethrough. A manifold with an input connection for receiving the liquid phase line and an output connection for receiving the gas phase line may be provided with the heat collector. The manifold may have a combination output and input connection fluidly connected to the opening for inlet and outlet of the heat sink. The manifold may thus combine the gas phase line and the liquid phase line into a composite line that includes at least a portion of the gas phase line and a portion of the liquid phase line. The manifold may be integral with the heat sink or may be added to the heat sink.

In another form, a heat collector may comprise a heat sink including a mass of heat conductive material with a recess in the mass of material. There may be at least a gas phase line in the recess. The heat collector may further include a liquid phase line in the recess. A downstream end of the liquid phase line may be fluidly connected to and form a transition into the gas phase line. The transition may be adjacent to an upstream end of the gas phase line. The liquid phase line may be at least partially coextensive with the gas phase line. The liquid phase line may extend along a substantial portion of the gas phase line. The liquid phase line may be disposed inside the gas phase line.

The recess in the heat collector plate may be a longitudinal recess. A first end of the recess may include an opening in the heat sink. The opening may be an inlet and outlet opening. A second end of the recess may include a closed end within the mass of heat conductive material. A liquid phase line may be disposed in the recess and extend substantially to the closed end of the recess. The closed end of the recess may form a transition between the liquid phase line and the gas phase line. The heat collector may have a composite line including a plurality of lines. The plurality of lines may include the gas phase line. The composite line may be received in the recess.

In an embodiment of the present invention, a manifold for uniting a separate gas phase line and a separate liquid phase line into the composite line may be provided. The manifold may have a combined gas phase and liquid phase connection fluidly connected to the composite line. The manifold may have an upstream liquid phase input connection and a downstream gas phase output connection separate from the liquid phase inlet connection.

In still another embodiment, the system may include a plurality of liquid phase and gas phase lines for a cooling system. The plurality of lines may include an internal gas phase line, an external gas phase line connected to the internal gas phase line, and an external liquid phase line. The external liquid phase line and the external gas phase line may have substantially the same diameter. The plurality of lines may further include an internal liquid phase line. The internal liquid phase line may be disposed inside and extend along a major portion of the internal gas phase line.

The plurality of lines may include a manifold. The manifold may include a liquid phase input connection removably and/or fluidly connected to the external liquid phase line and a gas phase output connection removably and/or fluidly connected to the external gas phase line. The manifold may also have a combined gas phase and liquid phase connection removably and/or fluidly connected to the internal gas phase line and the internal liquid phase line. The internal gas phase line and the internal liquid phase line may form a composite internal line. The composite internal line may have a first end fluidly connected to the manifold and a second end fluidly connecting the internal liquid phase line to the internal gas phase line and forming a transition therebetween. The internal liquid phase line may be disposed inside the internal gas phase line.

The foregoing and other features and advantages will be apparent from the following more detailed description of the particular embodiments of the invention, and as illustrated in the accompanying drawings.

BRIEF DESCRIPTION OF THE DRAWINGS

FIG. 4A is a top plan view of a composite liquid phase and gas phase line that may be received into a heat collector plate in accordance with the present invention;

FIG. 4B is a partial sectional view taken along lines 4B-4B of FIG. 4A;

DETAILED DESCRIPTION OF EMBODIMENTS OF THE INVENTION

Figure 1:
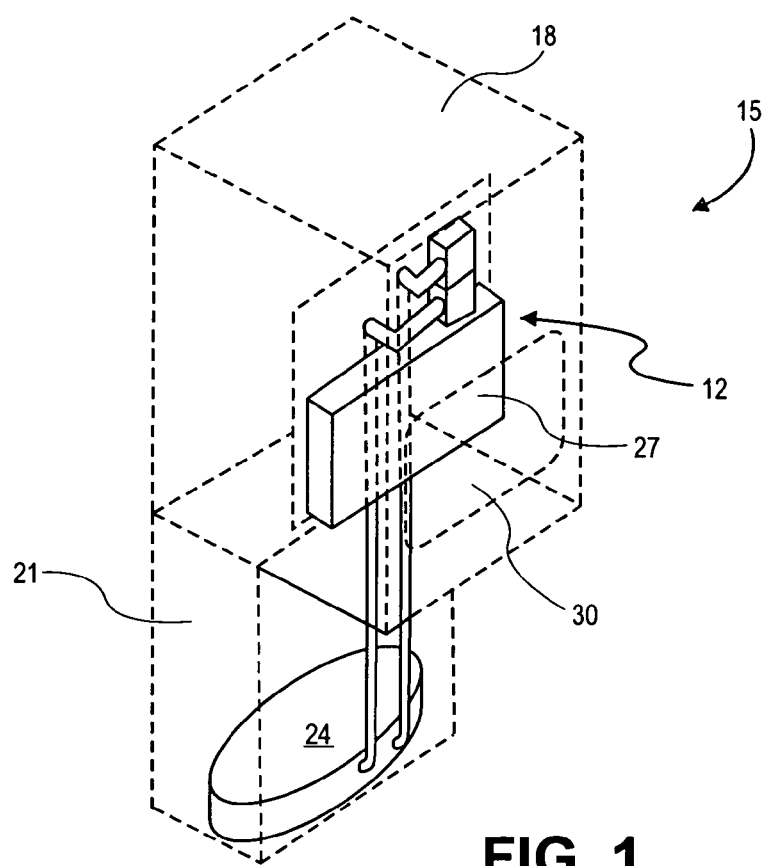
FIG. 1 is a perspective diagrammatic view showing a heat collector 12 in accordance with the present invention in conjunction with an exemplary electronic display.

As discussed above, embodiments of the present invention relate to a heat collector plate for an electronic display. As shown in FIG. 1, a heat collector 12 may be provided in a display 15 in order to collect and remove excess heat from a compartment 18 and dissipate the excess heat in a location remote from the compartment 18, such as in a housing base 21. In the exemplary view of FIG. 1, the housing base 21 contains a compressor 24. The housing base will also typically include fins or other heat dissipating components and structure. The present invention also relates to a heat collector, which may including a heat collector plate, a base plate, and/or an electronic display.

As shown in FIG. 1, a heat collector 12 may be provided in a display 15 in order to collect and remove excess heat from a compartment 18 and dissipate the excess heat in a location remote from the compartment 18, such as in a housing base 21. In the exemplary view of FIG. 1, the housing base 21 contains a compressor 24. The housing base will also typically include fins or other heat dissipating components and structure associated with the compressor 24.

Advantageously the compartment 18 is a thermally insulated enclosure. The compartment 18 may be kept relatively small, and include only the necessary components for the display and the heat collector. In the exemplary embodiment of FIG. 1, the heat collector 12 includes a plate 27 in thermally conductive communication with the display components. Thus, most of the heat transfer may be provided by conduction through the plate 27. Fans may also be incorporated to provide additional convective heat transfer.

As shown in FIG. 1, the display may include a window for viewing an electronic display such as a liquid crystal display (LCD), for example. The LCD used in conjunction with the display shown in FIG. 1 may be similar to those used in laptop computers, for example, and may be positioned generally between the heat collector plate 27 and a display window 30. As may be appreciated, when a display 15 is exposed to outdoor elements, the temperatures inside the display 15 will vary greatly without some kind of cooling device. As such, the electronics including the LCD screen will have a greatly reduced life span. By implementing the heat collector 12 of the present invention temperature fluctuation is greatly reduced. For example, the mean time before failure (MTBF) of a fifteen inch LCD with the present cooling heat collector 12 is estimated to be approximately five to approximately seven years as compared to an MTBF of approximately eighteen months to approximately twenty-four months with a ten to twelve inch screen and the cooling systems of the past. It is to be noted that the ten to twelve inch screens produce even less heat so that their temperature fluctuation may be decreased even further and their life expectancy is even greater with the cooling system of the present invention.

It is to be understood that the spirit and scope of the present invention includes cooling of displays including, but not limited to LCDs. By way of example and not by way of limitation, the present invention may be used with displays selected from among LCD (including TFT or STN type), light emitting diode (LED), field emitting display (FED), cathode ray tube (CRT), and plasma displays. Furthermore, the present invention may be used with displays of other types including those not yet discovered. In particular, it is contemplated that the present invention may be well suited for use with full color, flat panel LED displays.

Another advantage of the present invention is that the heat collector 12 is thermally separated from the compressor 24. In fact, the compressor 24 may be located remotely from the display. For example, a large common compressor could be located in a canopy or in a roof top location remote from one or more displays. This common compressor may be operatively connected to several heat collectors. When a common compressor is used with several displays, a regulator is also needed to control the flow of a two phase cooling fluid to and from the heat collector. This arrangement has the advantage of reducing costs associated with multiple compressors that otherwise would be required. Furthermore, the safety requirements of forming a barrier or locating the compressors at a safe distance from the displays is greatly simplified for gas pump display applications when a single compressor is connected to multiple pump displays, for example.

Another advantage of locating the heat dissipation components, (including compressor(s)) away from the location(s) at which the heat is collected is that heat transfer back into the compartment 18 by conduction and/or convection is greatly reduced. Also, the volume to be cooled may also be greatly reduced with the present invention. Therefore, the heat collector 12 of the present invention is much more efficient and effective in removing heat from the electronic components in a display than devices of the past.

Figure 2A:
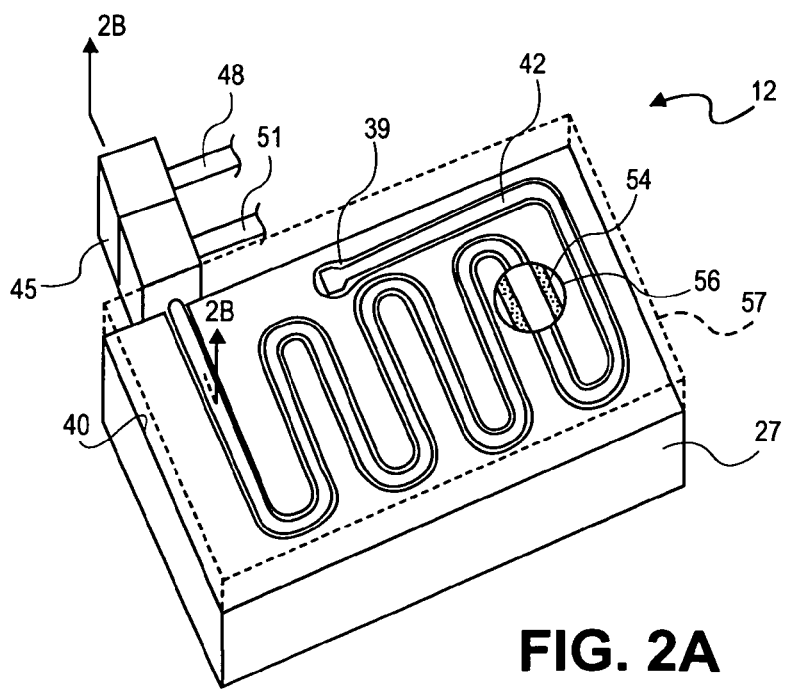
FIG. 2A is a is a perspective view of the heat collector of FIG. 1.

FIG. 2A is a perspective view of the heat collector 12. The heat collector 12 includes the heat collector plate 27 having a recess 39 in an upper surface 40 thereof for receiving a composite gas phase and liquid phase line 42 therein. The composite line 42 is connected to a manifold 45. The manifold 45 routes an external liquid phase line 48 and an external gas phase line 51 into and out of the composite line 42 respectively. A mastic 54 such as a thermal grease may be placed in the recess 39 to provide good thermal conduction between the composite line 42 and the heat collector plate 27, as shown in the enlarged view at 56. A cover 57 may be placed over the recess 39 and the composite line 42 in order to hold the composite line 42 in place. In an assembled state holding the composite line 42 in the recess 39, the cover 57 forms an integral part of the heat collector plate 27 and provides a uniform outer surface for the plate 27.

Figure 2B:
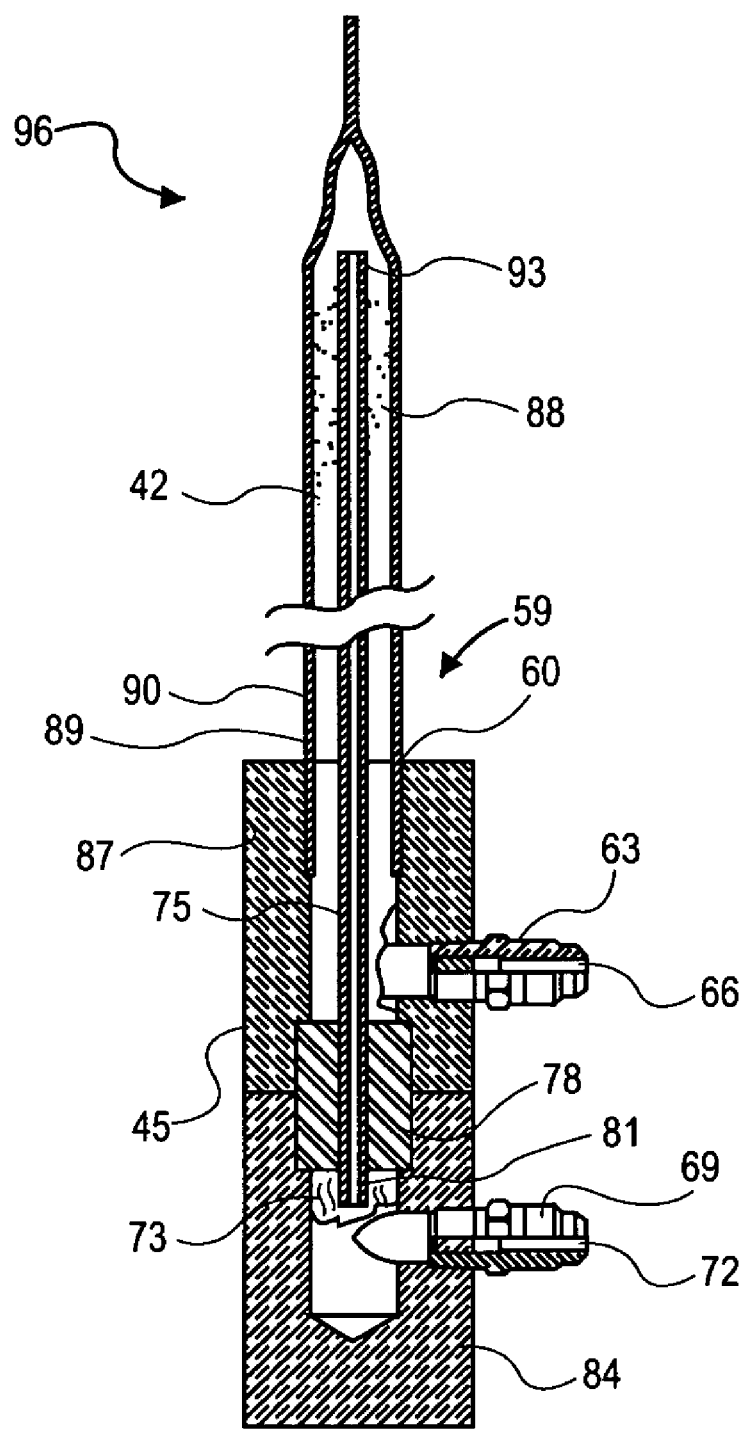
FIG. 2B is a partial sectional view of a manifold and lines taken along lines 2B-2B of FIG. 2A.

FIG. 2B is a partial sectional view taken along lines 2B-2B of FIG. 2A. The manifold 45 has a combined input and output connection 59 provided by an opening 60 receiving the composite line 42 therein. The manifold 45 also has an output connection 63 provided by a nipple. The output connection 63 provides an output opening 66. The manifold 45 also has an input connection 69 provided by another nipple. The input connection 69 provides an input opening 72. The input connection 69 receives a liquid phase material 73 from an external liquid phase line and directs the liquid phase material 73 through the manifold 45 and into an internal liquid phase line 75. A plug 78 receives a first end 81 of the internal liquid phase line 75 and holds it in place within the manifold 45. The plug 78 also isolates an liquid phase input portion 84 of the manifold 45 from a gas phase output portion 87 thereof. Thus, the liquid phase material 73 flows into the input portion 84 of the manifold 45 and into the internal liquid phase line 75 while a gas phase output portion of the material 88 flows generally in the opposite direction from a first end 89 of an internal gas phase line 90 into the gas phase portion 87 of the manifold 45 and out of the output connection 63.

As shown in FIG. 2B, the composite line 42 includes the internal gas phase line 90 and the internal liquid phase line 75 disposed inside the internal gas phase line 90. Thus, the material 73 flows into the composite line 42 via the internal liquid phase line 75. When the material 73 reaches a second end 93 of the internal liquid phase line, the material flows out of the second end 93 of the internal liquid phase line 75 and expands into a gas 89 in a second end 96 of the internal gas phase line 90.

Thus, the internal liquid phase line 75 is generally surrounded by a gas phase portion 88 of the material as it flows out of the heat collector plate 27 and the manifold 45. This arrangement has several advantages. For example, the internal liquid phase line 75 may be a copper capillary tube, which is relatively fragile. Therefore, placement of the internal liquid phase line 75 inside the internal gas phase line 90 has the advantage of protecting the internal liquid phase line 75. In the past, the external liquid phase line has been provided by a capillary line similar to the internal line 75. However, the liquid phase line has been kept external to the heat collector plate. As such, the external liquid phase lines have been vulnerable to damage as they carry liquid phase material from the compressor to the heat collector. This disadvantage is avoided by the present invention.

Furthermore with the present invention, the liquid phase material may be brought from the compressor to the manifold in an external liquid phase line that is substantially the same shape and size as the external gas phase line. Hence, both the external gas phase line and external liquid phase line may be provided by a universal line. This configuration thus provides greater efficiency in stocking parts, and simplifies installation and replacement of the external lines. Another advantage is provided in that the liquid phase material in the internal liquid phase line 75 is cooled as it moves from the first end 81 to the second end 93 of the internal liquid phase line 75.

As can be appreciated, the assembly of the manifold 45 with the composite line 42 is facilitated by the configuration of the liquid phase input portion 84 and the gas phase output portion 87 of the manifold 45. In particular, the manifold 45 generally forms a shell with recesses in respective liquid phase and gas phase portions 84, 87 for receiving the plug 78 therein. The plug fits snugly within each of these recesses to form a sealed connection that does not permit escape of the liquid and gas phase material 73, 88. Thus, when the manifold 45 is in its assembled configuration, the plug 78 forms a barrier that prevents the material from escaping and isolates the liquid phase material from the gas phase material.

Figure 3A:
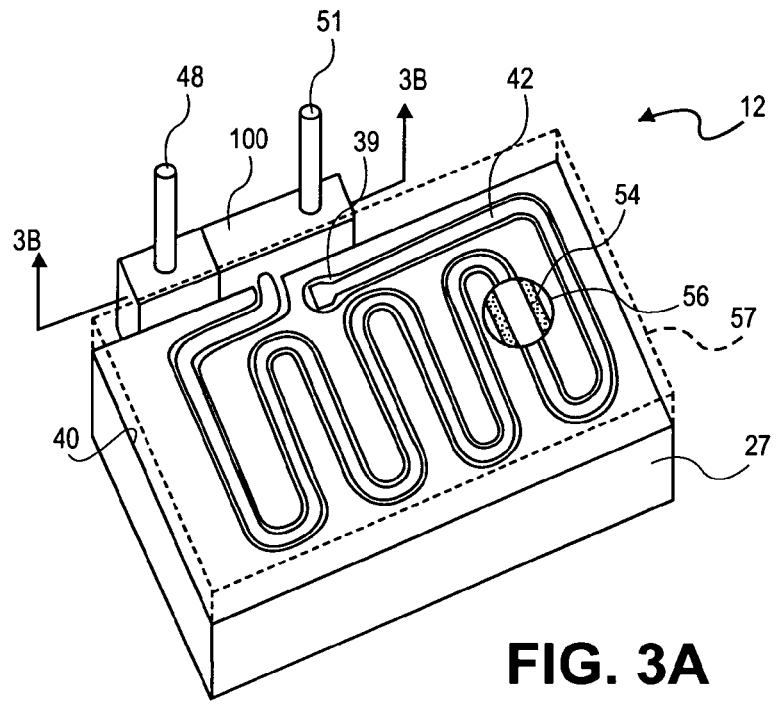
FIG. 3A is a perspective view of the heat collector having an alternative manifold thereon.

FIG. 3A is a perspective view of the heat collector 12 with an alternative embodiment of a manifold 100 thereon. The heat collector 12 includes the heat collector plate 27 having a recess 39 in an upper surface 40 thereof for receiving a composite gas phase and liquid phase line 42 therein, as described with regard to FIG. 2A above. The composite line 42 is connected to the manifold 100. The manifold 100 routes an external liquid phase line 48 and an external gas phase line 51 into and out of the composite line 42 respectively. The remaining aspects and function of the embodiment of FIG. 3A are substantially similar to those of FIG. 2A as described above.

Figure 3B:
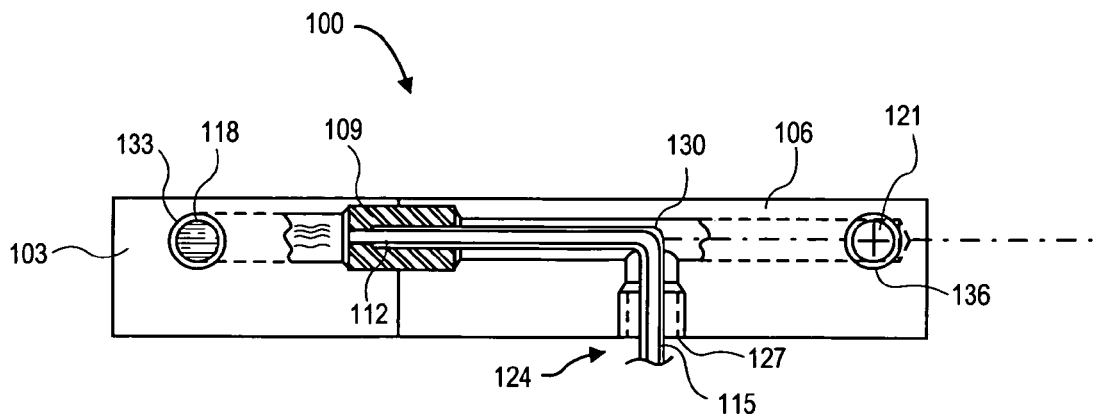
FIG. 3B is a partial sectional view taken along lines 3B-3B showing the alternative embodiment of the manifold that may be used with the heat collector of FIGS. 1 and 2A.

FIG. 3B shows the alternative embodiment of the manifold 100 including a liquid phase portion 103 and a gas phase portion 106. Similar to the embodiment shown and described with regard to FIG. 2B, the manifold 100 accommodates a plug 109. The plug 109 holds a first end 112 of an internal liquid phase line 115. The plug 109 also isolates a liquid phase portion 118 of the material from a gas phase portion 121 of the material. In this embodiment, an input and output connection 124 for connection with a composite line is provided by an opening 127. In order to provide the internal liquid phase line 115 inside of the internal gas phase line, the internal liquid phase line 115 has a bend 130. This configuration permits an input connection 133 and an output connection 136 to lie in closer proximity to the heat collector plate 27. Otherwise, the manifold 100 functions generally similarly to the manifold 45 shown and described above with regard to FIG. 2B.

FIG. 4A shows the composite line 42 including the internal liquid phase line 75 and the internal gas phase line 90. As may be appreciated, the composite line 42 may be bent into a serpentine or any other configuration in order to be accommodated in a recess such as recess 39 in the heat collector plate 27 as shown in FIG. 2A. As further may be appreciated, the internal liquid phase line 75 may be inserted into the internal gas phase line 90 before the composite line 42 is bent into a predetermined configuration. Alternatively, the internal liquid phase line 75 may be forced into the internal gas phase line 90 and thus be formed to the shape of the internal gas phase line 90 as it is inserted.

FIG. 4B is a partial sectional view taken along lines 4B-4B of FIG. 4A. The internal liquid phase line 75 may extend along a major portion of the internal gas phase line 90. FIG. 4B also shows that the second end 96 of the internal gas phase line may be closed by flattening. As shown, the second end 93 of the internal liquid phase line reaches to a position proximate to the second end 96 of the internal gas phase line 90. The internal liquid phase line 75 is sheathed and protected by the internal gas phase line 90. While additional structure or elements could be provided to secure the internal liquid phase line 75 inside the internal gas phase line 90, such securing is not considered to be necessary since there is relatively little distance between the internal liquid phase line and the internal gas phase line 90. While the composite line 42 could be formed into any shape, and the internal liquid phase line 75 could extend to any location along a length of the internal gas phase line 90, it is to be understood that an advantage may be obtained by providing a configuration in which the internal gas phase line 90 has a first length greater than or equal to the internal liquid phase line 75. In one case, of the composite line 42 may have a length greater than or equal to approximately 87 inches to approximately 91 inches or more so that the internal liquid phase line 75 may have a length of approximately 87 inches to approximately 91 inches and be accommodated inside the internal gas phase line 90. Having the internal liquid phase line of this length provides the advantage of obviating the need for an expansion valve. This is because the internal liquid phase line having a length in this range and a small inner diameter restricts the flow of the liquid phase material until the material exits the second end 93 of the internal liquid phase line 75. In this way the internal liquid phase line 75 can provide a similar restriction and function to that of an expansion valve.

Figure 5:
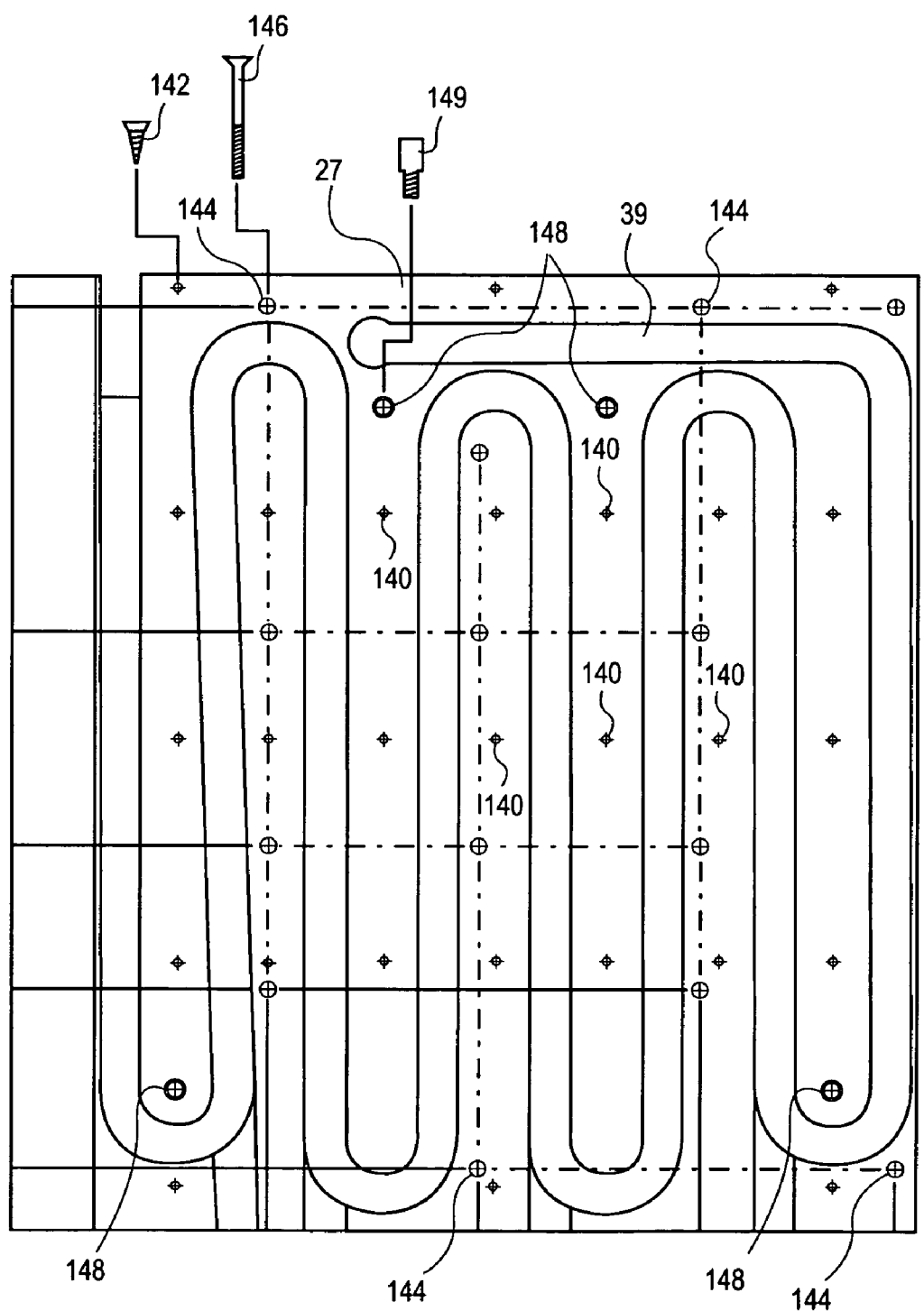
FIG. 5 is a top plan view of a heat collector plate in accordance with the present invention.

FIG. 5 is a top plan view of the heat collector plate 27, with the recess 39 formed therein. The heat collector plate 27 has first apertures 140 for receiving first fasteners 142 (only one of which is shown in FIG. 5) that attach the cover 57 to the heat collector plate 27. The heat collector plate 27 has second apertures 144 for receiving second fasteners 146 (only one shown) therethrough to hold the heat collector plate 27 in a secured condition inside the display 15, for example. To this end, the second fasteners 146 may engage in a base in the form of a base plate so that when they are tightened, the heat collector plate 27 is drawn into contact with the base plate. The heat collector plate 27 has third apertures 148 that fixedly receive third fasteners 149 in the form of indicator pins. The third fasteners 149 may be configured to extend away from the heat collector plate 27 far enough to protrude through any insulation and any enclosure cover that helps to form the enclosure within the compartment 18. In this way, the position indicator pins will protrude out of the enclosure cover a first distance before the second fasteners 146 are properly engaged and tightened to secure the heat collector plate 27 to the display 15. Due to its resilient nature, the insulation acts as a spring that resiliently biases the enclosure cover away from the heat collector plate 27. However, the insulation is compressed during tightening of the second fasteners 146.

After the second fasteners 146 have been properly seated and tightened sufficiently, the position indicating pins will protrude out of the enclosure cover to a second distance greater than the first distance, thus indicating that the second fasteners 146 are properly engaged and sufficiently tightened. In this way, the second and third fasteners 146, 149 together provide a position indicator mechanism that advantageously enables a user to determine whether the heat collector plate 27 has been properly installed.

It is to be understood that a large number of first apertures 140 and a large number of second apertures 144 and corresponding first and second fasteners 142, 146 are needed in order to assure that the cover 57 holds the composite line 42 in the recess 39 throughout an entire length of the recess 39. Furthermore, the first fasteners 142 ensure that the composite line 42 is held in thermal communication with any thermal mastic in the recess 39. Thus, proper thermal conduction between the composite line 42 and the heat collector plate 27 is also assured by the large number of first apertures 140 and fasteners 142. Another requirement is that the cover 57 needs to be thick enough to prevent warping or bending away from the recess and lines therein. Thus, the cover may comprise a metal plate that has a thickness of approximately ⅛ inch or greater. Likewise, the large number of second apertures 144 and second fasteners 146 is required to assure that the heat collector plate 27 is held in good thermal contact with the base or other elements within the display 15. Thus, an exceedingly tight, efficient, and effective heat collector is provided.

Figure 6A:
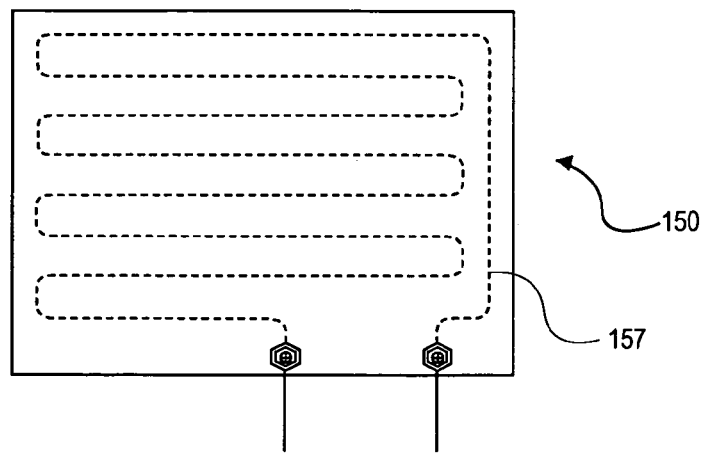
FIGS. 6A-6C are diagrammatic top plan views of heat collector plates of additional embodiments in accordance with the present invention.
Figure 6B:
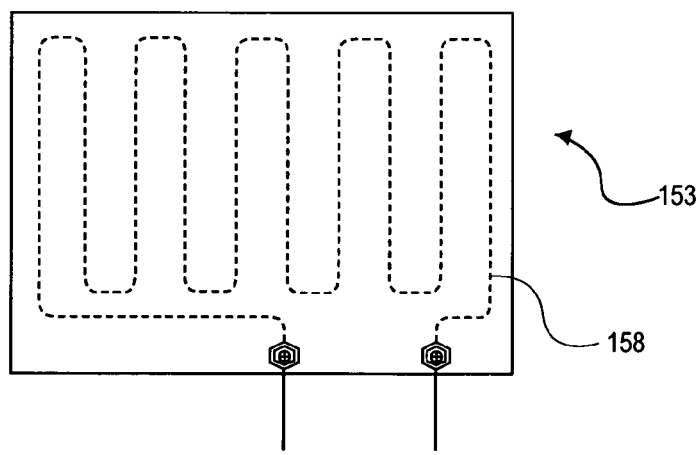
Figure 6C:
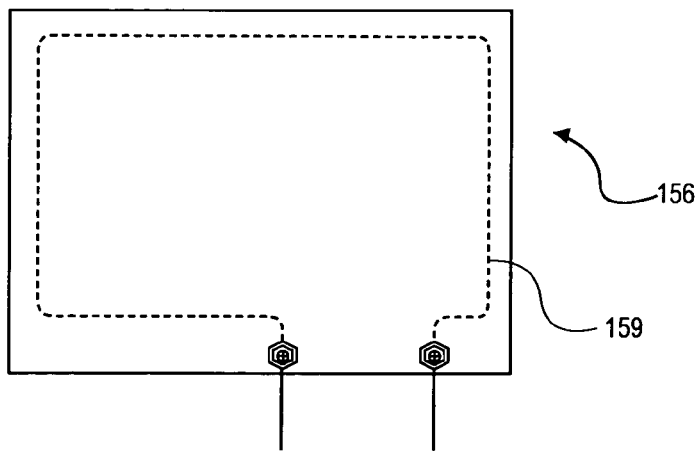

FIGS. 6A-6C are diagrammatic top plan views of heat collector plates 150, 153, and 156 respectively. In particular, it is noted that the interior or composite lines 157, 158, 159 may be provided in any number of configurations. The embodiments of FIGS. 6A-6C show separate inlet and outlet connections. In these configurations, an internal composite line 157, 158, 159 may have a transition between a liquid phase portion and a gas phase portion at any point along the internal line.

Figure 7:
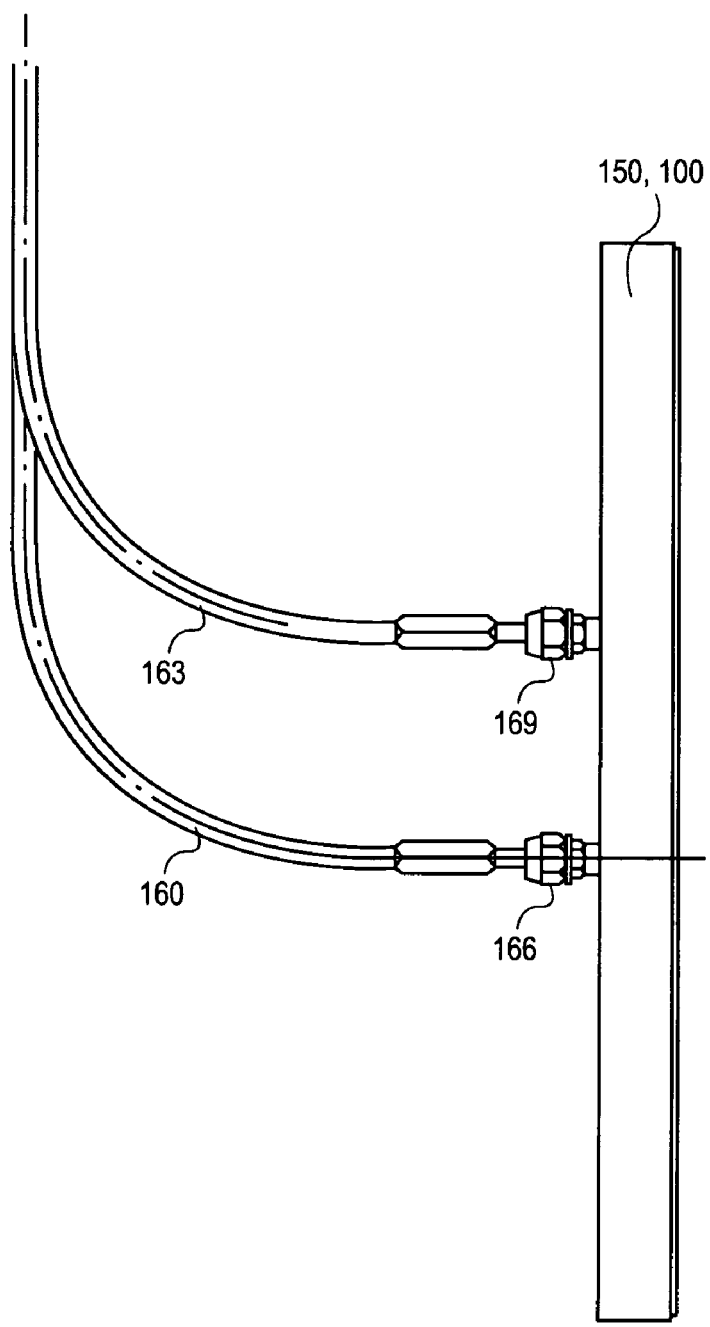
FIG. 7 is a side plan view of external liquid and gas phase lines connected to a manifold or a heat collector plate in accordance with the present invention.

FIG. 7 shows an external liquid phase line 160 and an external gas phase line 163. Input connection 166 and output connection 169 may be separate connections directly in a heat collector plate 150, or into a manifold 100 such as that shown in FIG. 3B. It is further to be understood that the heat collector plate may be configured to include an integral manifold. In this way, additional parts would not be required in order to provide isolation of the liquid and gas phases from each other. Alternatively, isolation of the phases in an integral manifold may be provided by a plug similar to those shown in FIGS. 2B and 3B, for example.

Figure 8:
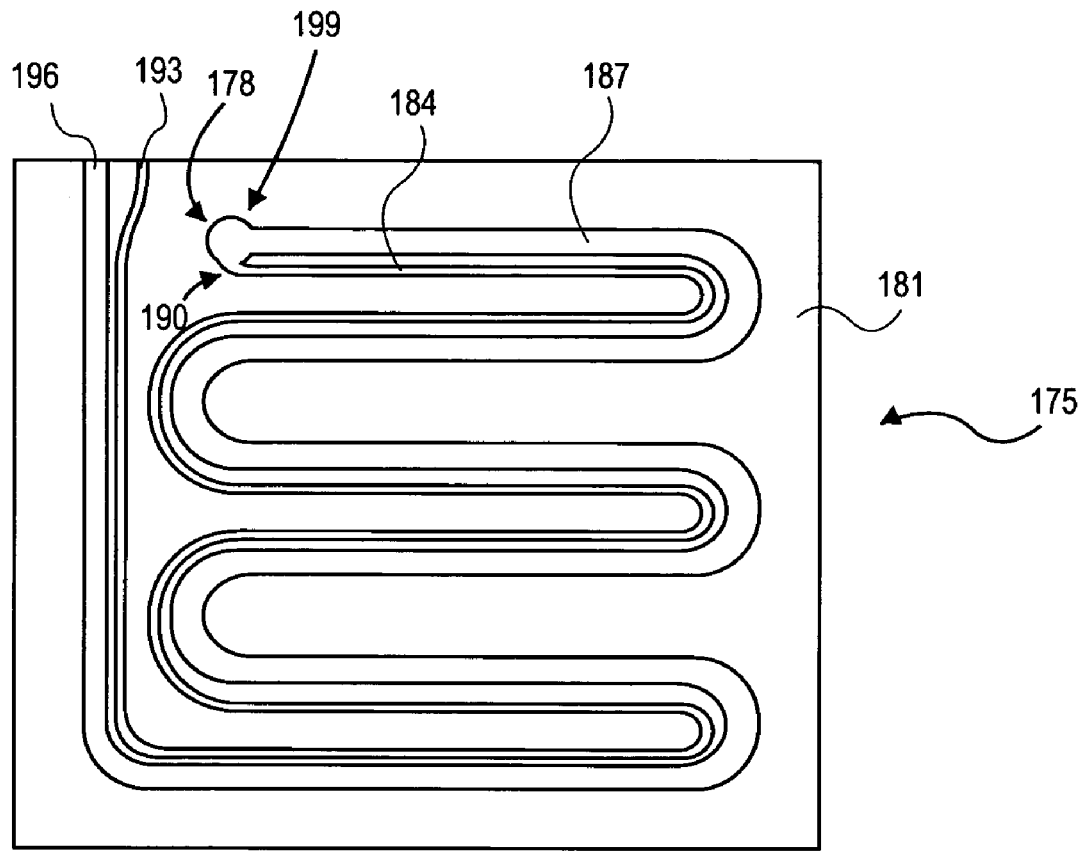
FIG. 8 is a top plan view of an alternative embodiment of a heat collector plate having integral liquid and gas phase lines formed in the plate.

FIG. 8 is another alternative embodiment of a heat collector plate 175 having an integral composite liquid phase and gas phase line 178 formed therein. As may be appreciated, the heat collector plate 175 may be formed of a thermally conductive material such as aluminum, for example. The composite liquid phase and gas phase line 178 may be machined into the upper surface 181 of the heat collector plate 175. As shown, the composite liquid phase and gas phase line 178 may include a liquid phase line 184 and a gas phase line 187. A transition 190 is formed between the liquid phase line 184 and the gas phase line 187. A cover such as shown at 57 in FIG. 2A may be provided together with gasket material in order to cover the upper surface 181 and to seal the composite line 178 so that the two phase material is held in the composite line 178.

As may be appreciated, the transition 190 provides an expansion valve effect similar to that which has been described with regard to the internal liquid phase line above. Respective inlet and outlet connections may be provided at openings 193 and 196 for connection with respective external liquid phase and external gas phase lines. Alternatively, the internal gas phase line 187 may be formed in the heat collector plate 175 and the internal liquid phase line could be added by placing an internal capillary line inside the integral gas phase line 187. In this case, the integral liquid phase line 184 would not be formed in the heat collector plate 175. Rather the internal gas phase line 187 would have the opening 196 at a first end and be closed at a second end 199. The internal liquid phase line could thus be placed in the recess formed by the internal gas phase line 187 and could extend to a location proximate to the second end 199 of the integral gas phase line 187 as described with regard to the embodiments of FIGS. 1-5 above.

It is to be understood that the liquid phase and gas phase lines of the present invention may be formed in any variety of ways including providing preformed lines as has been shown and described above, machining the line(s) directly into the heat collector plate, or molding the plate 27 to include one or more lines as has been shown and described. The heat collector plate may be formed of any of the variety of materials including, but not limited to, aluminum. For example, there are many plastics which have good heat conductive properties that may be used to form heat collector plates in accordance with the present invention. The heat collector plate may comprise a plurality of components held together by screw or adhesives. Alternatively, the heat collector plate may be molded as a single piece. The two phase material may be any of a variety of refrigerant fluids known or not yet discovered.

The embodiments and examples set forth herein were presented in order to best explain the present invention and its practical application and to thereby enable those of ordinary skill in the art to make and use the invention. However, those of ordinary skill in the art will recognize that the foregoing description and examples have been presented for the purposes of illustration and example only. The description as set forth is not intended to be exhaustive or to limit the invention to the precise form disclosed. Many modifications and variations are possible in light of the teachings above without departing from the spirit and scope of the forthcoming claims.

The invention claimed is:

1. A heat collector, comprising:
a heat sink including a plate of heat conductive material;
a longitudinal recess in the plate of material;
at least a gas phase line in the recess; and
a liquid phase line in the recess, wherein the liquid phase line is disposed inside the gas phase line.

2. A heat collector of claim 1, wherein a downstream end of the liquid phase line is fluidly connected to and forms a transition into the gas phase line.

3. A heat collector of claim 2, wherein the transition is adjacent to an upstream end of the gas phase line.

4. The heat collector of claim 1, wherein the liquid phase line is at least partially coextensive with the gas phase line.

5. The heat collector of claim 1, wherein the liquid phase line extends along a substantial portion of the gas phase line.

6. The heat collector of claim 1, wherein a first end of the recess comprises an opening in the plate, the opening being an inlet and outlet opening.

7. The heat collector of claim 6, wherein a second end of the recess comprises a closed end within the plate of heat conductive material.

8. The heat collector of claim 7, further comprising a liquid phase line in the recess extending substantially to the closed end of the recess;
wherein the closed end of the recess forms a transition between the liquid phase line and the gas phase line.

9. The heat collector of claim 1, further comprising a composite line including a plurality of lines including said gas phase line.

10. The heat collector of claim 9, wherein the composite line is received in the recess.

11. The heat collector of claim 9, further comprising:
a manifold for uniting a separate gas phase line and a separate liquid phase line into the composite line; and
the manifold having a combined gas phase and liquid phase connection fluidly connected to the composite line.

12. The heat collector of claim 11, wherein the manifold has an upstream liquid phase input connection and a downstream gas phase output connection separate from the liquid phase inlet connection.

13. The heat collector of claim 11, wherein the manifold is integral with the plate of heat conductive material.

14. The heat collector of claim 11, wherein the manifold is added to the plate of heat conductive material.

15. The heat collector of claim 1, wherein the longitudinal recess comprises a channel.

16. The heat collector of claim 15, wherein the channel is serpentine and the gas phase line is serpentine and fits into the channel.

17. The heat collector of claim 15, further comprising a thermally conductive material between at least a portion of the gas phase line and the plate to improve conductive heat transfer.

18. The heat collector of claim 15, further comprising a liquid phase line in the channel, wherein the liquid phase line extends coincidentally with the gas phase line.

19. The heat collector of claim 18, wherein the liquid phase line is integral with the gas phase line.

20. The heat collector of claim 1, wherein the gas phase line is at least partially formed by a portion of the plate.

21. The heat collector of claim 20, wherein the liquid phase line is at least partially formed by a portion of the plate.

22. The heat collector of claim 1, further comprising a heat sink cover plate mounted to the plate of heat conductive material with at least a portion of the gas phase line between the heat sink cover plate and the plate of heat conductive material.

23. The heat collector of claim 1, further comprising through holes in the heat conductive material for receiving fasteners therethrough.

24. A plurality of liquid phase and gas phase lines for a cooling system, comprising:
an internal gas phase line;
an external gas phase line connected to the internal gas phase line;
an external liquid phase line; and
wherein the external liquid phase line and the external gas phase line have substantially the same diameter;
an internal liquid phase line
wherein the internal liquid phase line is disposed inside and extends along a major portion of the internal gas phase line.

25. The plurality of liquid phase and gas phase lines in claim 24, further comprising:
a manifold;
the manifold having: a liquid phase input connection fluidly connected to the external liquid phase line, a gas phase output connection fluidly connected to the external gas phase line; and
a combined gas phase and liquid phase connection fluidly connected to the internal gas phase line and the internal liquid phase line.

26. The plurality of liquid phase and gas phase lines in claim 24, wherein the internal gas phase line and the internal liquid phase line form a composite internal line.

27. The plurality of liquid phase and gas phase lines in claim 26, wherein the composite internal line has a first end fluidly connected to a manifold and a second end fluidly connecting the internal liquid phase line to the internal gas phase line and forming a transition therebetween.

28. The plurality of liquid phase and gas phase lines of claim 27, wherein the internal liquid phase line is disposed inside the internal gas phase line.

* * * * *